United States Patent [19]
Yamazaki et al.

[11] Patent Number: 5,821,559
[45] Date of Patent: Oct. 13, 1998

[54] ELECTRIC DEVICE, MATRIX DEVICE, ELECTRO-OPTICAL DISPLAY DEVICE, AND SEMICONDUCTOR MEMORY HAVING THIN-FILM TRANSISTORS

[75] Inventors: Shunpei Yamazaki, Tokyo; Yasuhiko Takemura, Shiga, both of Japan

[73] Assignee: Semiconductor Energy Laboratory Co., Ltd., Kanagawa-ken, Japan

[21] Appl. No.: 413,885

[22] Filed: Mar. 30, 1995

Related U.S. Application Data

[60] Division of Ser. No. 268,446, Jun. 30, 1994, which is a continuation-in-part of Ser. No. 19,880, Feb. 19, 1993, and a division of Ser. No. 68,672, May 28, 1993, abandoned, which is a continuation-in-part of Ser. No. 836,797, Feb. 18, 1992, Pat. No. 5,218,464, and a continuation-in-part of Ser. No. 846,164, Mar. 5, 1992, Pat. No. 5,289,030.

[30] Foreign Application Priority Data

| Feb. 16, 1991 | [JP] | Japan | 3-077318 |
| Mar. 6, 1991 | [JP] | Japan | 3-065418 |
| May 11, 1991 | [JP] | Japan | 3-135569 |
| May 29, 1992 | [JP] | Japan | 4-164302 |

[51] Int. Cl.[6] ............................. H01L 29/04; H01L 29/78
[52] U.S. Cl. ............................. 257/57; 257/66; 257/347; 257/368; 257/379; 359/55; 359/59
[58] Field of Search .................... 257/346, 347, 257/349, 352, 285–287, 55, 57, 63, 66, 67, 77, 368, 369, 378, 379; 359/54, 55, 59

[56] References Cited

U.S. PATENT DOCUMENTS

| 4,380,008 | 4/1983 | Kawakami et al. ..................... 340/784 |
| 4,413,256 | 11/1983 | Yasuda et al. ........................... 340/784 |
| 4,432,610 | 2/1984 | Kobayashi et al. ...................... 359/59 |
| 4,525,436 | 6/1985 | Yamazaki ................................ 429/111 |
| 4,605,972 | 8/1986 | Hatanaka ................................ 358/302 |
| 4,641,156 | 2/1987 | Ohta et al. .............................. 346/160 |
| 4,709,995 | 12/1987 | Kuribayashi et al. ................. 350/350 S |
| 4,727,044 | 2/1988 | Yamazaki .................................. 257/52 |
| 4,769,713 | 9/1988 | Yasui ......................................... 345/89 |
| 4,775,641 | 10/1988 | Duffy et al. ............................. 257/349 |
| 4,783,145 | 11/1988 | Hatanaka et al. ......................... 359/55 |
| 4,808,991 | 2/1989 | Tachiuchi et al. ........................ 359/55 |
| 4,816,893 | 3/1989 | Mayer et al. ............................ 257/349 |
| 4,818,077 | 4/1989 | Ohwada et al. ..................... 350/350 S |
| 4,836,654 | 6/1989 | Fujimura et al. ........................ 350/346 |
| 4,838,654 | 6/1989 | Hamaguchi et al. ...................... 359/59 |
| 4,884,079 | 11/1989 | Inoue et al. ............................... 359/55 |
| 4,916,090 | 4/1990 | Motai et al. ............................. 257/349 |
| 4,929,058 | 5/1990 | Numao ...................................... 359/55 |
| 4,930,874 | 6/1990 | Mitsumune et al. ....................... 359/59 |
| 4,938,565 | 7/1990 | Ichikawa ................................. 350/332 |
| 4,942,441 | 7/1990 | Konishi et al. ............................ 257/72 |

(List continued on next page.)

FOREIGN PATENT DOCUMENTS

| 0144297 | 12/1978 | Japan ....................................... 359/59 |
| 0011329 | 1/1980 | Japan ....................................... 257/63 |
| 0099778 | 6/1982 | Japan ...................................... 257/349 |
| 0081621 | 5/1984 | Japan . |
| 0159544 | 9/1984 | Japan ...................................... 257/412 |
| 0113971 | 6/1985 | Japan ....................................... 257/63 |
| 0269358 | 11/1987 | Japan ....................................... 257/55 |
| 0282464 | 12/1987 | Japan ....................................... 257/63 |
| 0096636 | 4/1988 | Japan ....................................... 359/59 |
| 0159826 | 7/1988 | Japan ....................................... 359/34 |
| 0194351 | 8/1989 | Japan ....................................... 257/72 |
| 0089030 | 3/1990 | Japan . |
| 0154383 | 7/1991 | Japan ...................................... 257/349 |

*Primary Examiner*—Peter Toby Brown
*Attorney, Agent, or Firm*—Sixbey, Friedman, Leedom & Ferguson, PC; Gerald J. Ferguson, Jr.; Eric J. Robinson

[57] ABSTRACT

A circuit adapted to dynamically activate an electro-optical display device is constructed from a thin-film gate-insulated semiconductor device. This device comprises PMOS TFTs producing only a small amount of leakage current. Besides the dynamic circuit, a CMOS circuit comprising both NMOS and PMOS thin-film transistors is constructed to drive the dynamic circuit.

19 Claims, 4 Drawing Sheets

U.S. PATENT DOCUMENTS

| | | | |
|---|---|---|---|
| 4,959,700 | 9/1990 | Yamazaki | 257/59 |
| 4,960,719 | 10/1990 | Tanaka et al. | 257/347 |
| 4,994,877 | 2/1991 | Ino et al. | 257/72 |
| 5,111,261 | 5/1992 | Tanaka et al. | 257/349 |
| 5,117,298 | 5/1992 | Hirai | 359/55 |
| 5,162,901 | 11/1992 | Shimada et al. | 257/59 |
| 5,165,075 | 11/1992 | Hiroki et al. | 359/59 |
| 5,193,018 | 3/1993 | Wu | 359/59 |
| 5,218,464 | 6/1993 | Hiroki et al. | 257/57 |
| 5,275,872 | 1/1994 | Chang | 428/210 |
| 5,280,280 | 1/1994 | Hotto | 345/94 |
| 5,287,095 | 2/1994 | Kitazima et al. | 345/99 |
| 5,289,030 | 2/1994 | Yamazaki et al. | 257/410 |
| 5,349,366 | 9/1994 | Yamazaki et al. | 359/59 |
| 5,365,080 | 11/1994 | Yamazaki et al. | 257/66 |
| 5,414,442 | 5/1995 | Yamazaki et al. | 345/89 |
| 5,485,019 | 1/1996 | Yamazaki et al. | 257/57 |
| 5,514,879 | 5/1996 | Yamazaki | 257/65 |

ELECTRIC DEVICE, MATRIX DEVICE, ELECTRO-OPTICAL DISPLAY DEVICE, AND SEMICONDUCTOR MEMORY HAVING THIN-FILM TRANSISTORS

This application is a divisional application of Ser. No. 08/268,446 filed Jun. 30, 1994, which is a continuation-in-part of U.S. application Ser. No. 08/019,880 filed Feb. 19, 1993, the '446 application further being a divisional application of Ser. No. 08/068,672 filed May 28, 1993 (now abandoned), which in turn is a continuation in part of Ser. No. 07/836,797 filed Feb. 18, 1992 (now U.S. Pat. No. 5,218,464) and a continuation in part of Ser. No. 07/846,164 filed Mar. 5, 1992 (now U.S. Pat. No. 5,289,030).

FIELD OF THE INVENTION

The present invention relates to matrix devices which have a matrix structure, have MOSFETs or MISFETs (collectively referred to as MOS devices) as switching devices, and perform dynamic operation such as liquid-crystal displays and dynamic RAMs (DRAMs). Examples of these matrix devices include electro-optical display devices and semiconductor memories. The invention also relates to a circuit for driving such matrix devices. More particularly, the invention relates to a device using thin-film transistors such as thin-film transistors formed as MOS devices on an insulating substrate.

BACKGROUND OF THE INVENTION

Recently, researches have been carried out on insulated-gate semiconductor devices comprising active layers (also known as active regions) in the form of thin films on an insulating substrate. Especially, thin-film insulated-gate transistors, or so-called thin-film transistors (TFTs) have been earnestly investigated. These devices are intended to be used to control pixels on a display device having a matrix structure such as a liquid-crystal display. They are classified into amorphous silicon TFTs or polysilicon TFTs according to the used semiconductor material and the state of the crystal. Also, researches have recently been made on materials showing a condition intermediate between polysilicon and amorphous state. These materials are called semi-amorphous materials and considered as an amorphous structure in which crystallites are floating. This kind of material is an excellent one combining both high mobility or a single-crystal condition and low leakage current of an amorphous state, as described later.

Furthermore, polysilicon TFTs are used on an integrated circuit of single-crystal silicon. This is known as SOI (silicon-on-insulator) technique. For example, these TFTs are used as load transistors in an SRAM of large scale integration. In this case, however, amorphous silicon TFTs are quite rarely employed.

A semiconductor circuit on an insulating substrate can operate at a quite high speed because conductive interconnects are not capacitance-coupled to the substrate. A proposal has been made to use semiconductor circuits of this kind as ultrahigh-speed microprocessors and ultrahigh-speed memories.

Generally, amorphous semiconductors have low field mobilities and thus cannot be used in those TFTs which are required to operate at high speeds. Also, P-type amorphous silicon has an extremely low field mobility and so it is impossible to fabricate P-channel TFTs, or PMOS TFTs. Therefore, it is impossible to fabricate complementary MOS (CMOS) circuits by combining P-channel TFTs, or PMOS TFTs, and N-channel TFTs, or NMOS TFTs.

However, TFTs fabricated from an amorphous semiconductor have the advantage that they have low OFF current. Hence, these TFTs are used in applications where very high speed operation is not required, only one conductivity type suffices, and electric charge must be held well, such as active-matrix transistors of a liquid-crystal device.

On the other hand, polycrystalline semiconductors have larger field mobilities than amorphous semiconductors and hence are capable of high-speed operation. For example, TFTs using a silicon film recrystallized by laser annealing show a field mobility as high as 300 $cm^2/V \cdot s$, which is very much large like field mobility of about 500 $cm^2/V \cdot s$ of MOS transistors formed on a normal single-crystal silicon substrate. The operating speed of a MOS circuit on a single crystal of silicon is limited by the parasitic capacitance between the substrate and the conductive interconnects. In contrast, in case of the polycrystalline semiconductors (the recrystallized silicon film), such restrictions do not exist because the circuit lies on an insulating substrate. Consequently, an extremely high-speed operation is expected.

PMOS TFTs can be fabricated from polysilicon similarly to NMOS TFTs. Therefore, CMOS circuits can be formed. For example, active-matrix liquid-crystal displays having a so-called monolithic structure, i.e., not only the active-matrix portions but also peripheral portions such as drivers are fabricated from CMOS polycrystalline TFTs, are known.

TFTs used in the aforementioned SRAMs are formed, taking account of this point. PMOS devices are fabricated from TFTs and used as load transistors.

In normal amorphous TFTs, it is difficult to form source/drain regions by a self-aligning process as used in single-crystal IC fabrication techniques. Parasitic capacitance due to geometrical overlap of the gate electrodes and the source/drain regions presents problems. In contrast, polycrystalline TFTs can make use of a self-aligning process and, therefore, parasitic capacitance can be suppressed greatly.

Although polysilicon TFTs have features described above, some problems have been pointed out. In a general polysilicon TFT, an active layer is formed on an insulating substrate. A gate-insulating film and gate electrodes are formed on the active layer. This structure is known as the coplanar type. Though this structure can utilize a self-aligning process, it is difficult to reduce the leakage current (OFF current) from the active layer.

The causes of this leakage current are not fully understood but a major cause is due to interface-trapped charges created between the underlying base and the active layer. Accordingly, the problems of the leakage current are solved by fabricating the interface with meticulous care and reducing the interface trap density to such an extent that it is almost equal to the density at the interface between the gate-oxide film and the active layer.

In particular, in a high-temperature process (the highest process temperature is on the order of 1000° C.), a substrate is fabricated from quartz. A coating of silicon is formed on the substrate and thermally oxidized at about 1000° C. to form a clean surface. Then, an active silicon layer is formed by low-pressure CVD or other method.

In a low-temperature process (the highest process temperature is lower than 650° C.; also known as an intermediate-temperature process), a silicon oxide film having an interface trap density as low as that of the gate-insulated film is formed as a base film between the substrate and the active layer. Sputtering is an excellent method of forming the silicon oxide film. Oxide films having excellent characteristics can also be derived by ECR CVD or plasma-assisted CVD of TEOS.

However, it has been still impossible to reduce the leakage current. Especially, the leakage current from the NMOS was greater than that of the PMOS by one order of magnitude or more. We have conjectured that light doped n-type (n$^-$-type) of the active layer causes this great leakage current. In practice, we have observed with high reproducibility that the threshold voltages of PMOS and NMOS devices manufactured by high-temperature and low-temperature processes shift in the negative direction. Especially, in the case of high-purity silicon not doped with any other dopant, we have also inferred that the active layer becomes a light doped n-type (n$^-$-type) in case of poor crystallinity being obtained as in the case of amorphous silicon. Polycrystalline silicon fabricated by a high-temperature process contains numerous lattice defects and dangling bonds unlike a perfect single crystal of silicon. These become donors and supply electrons. Of course, the possibility of the effect of a trace amount of impurity elements such as sodium remains.

Figure 1A:
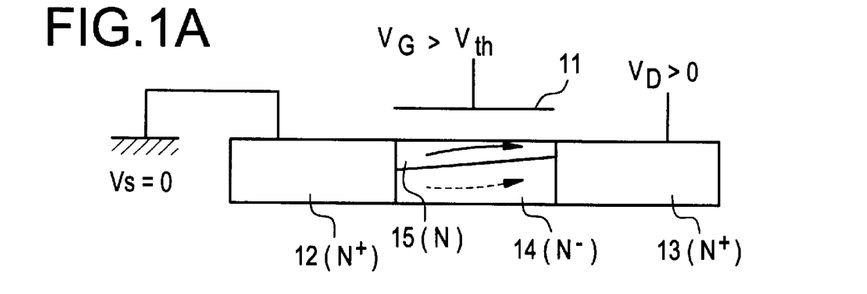
Figure 1B:
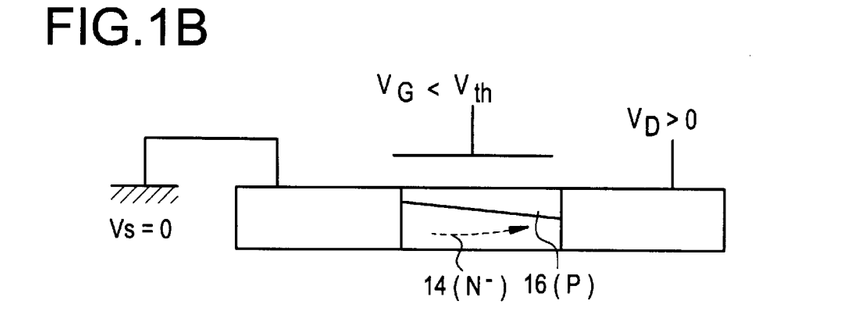

In any case, if any one of the above-described causes exists, then we can explain away the above phenomena, i.e. NMOS devices have much lower threshold voltages and a larger amount of leakage current than PMOS devices. This is illustrated in FIGS. 1, (A)–(B). As shown in FIG. 1(A), the N$^+$ source 12 of an NMOS is grounded. A positive voltage is applied to the N$^+$ drain 13. Under this condition, if a voltage higher than the threshold voltage $V_{th}$ of a gate electrode 11 is applied to it, then a channel is formed on the side of the gate electrode of an active layer 14, and a drain current flows as indicated by the arrow of the solid line. However, since the active layer 14 is of a weak N-type (N$^-$-type), an electrical current which hardly depends on the gate voltage flows from the source to the drain as indicated by the arrow of broken lines.

Even if the potential at the gate electrode is lower than the threshold voltage $V_{th}$, then the current indicated by the arrow of broken lines keeps flowing. If the potential at the gate electrode assumes a large negative value, a P-type inversion layer 16 is created, as shown in FIG. 1(B), but the channel is not entirely inverted. Conversely, if an excessive voltage is applied, electrons are accumulated on the opposite side of the gate, thus producing a channel. Data actually obtained about NMOS devices is consistent with the above consideration.

Figure 2A:
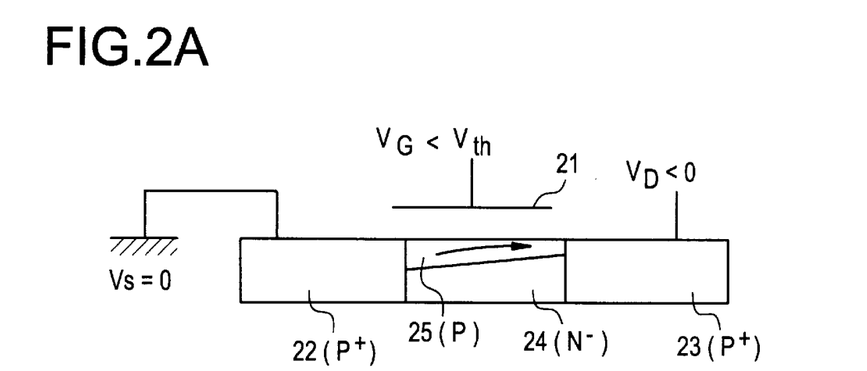
Figure 2B:
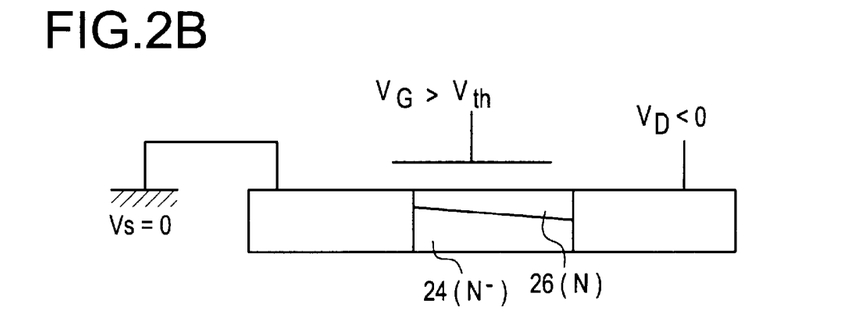

In the case of the PMOS, the threshold voltage is higher because the active layer is of N$^-$-type but the leakage on the opposite side of the gate is reduced greatly. FIG. 2, (A) and (B), show cases in which a voltage lower than the threshold voltage and a voltage exceeding the threshold voltage are respectively applied to the PMOS.

Such conspicuous leakage current from the NMOS is an impediment in various applications, especially in applications where dynamic operation is needed. For example, in active-matrix arrays of liquid crystals or DRAMs, image information or stored information is lost. Accordingly, it has been necessary to reduce such leakage current.

One method is to make the active layer of the NMOS intrinsic (I-type) or weak P-type. For instance, when the active layer is formed, an appropriate amount of P-type dopant such as boron is implanted only into the NMOS or into both NMOS and PMOS to make the active layer of the NMOS I-type or weak P-type. Then, the threshold voltage of the NMOS should increase, and the leakage current should decrease greatly. However, this method involves some problems.

Usually, a CMOS circuit comprising a substrate on which both NMOS devices and PMOS devices are fabricated is used. Where a dopant should be implanted only into the N-type, excess photolithography steps are needed. Where a P-type dopant should be implanted into the active layers of both NMOS and PMOS devices, subtle dopant implantation techniques are necessitated. If the dosage is too great, the threshold voltage of the PMOS decreases, and the leakage current increases.

Ion-implantation techniques also pose problems. In implantation techniques where mass separation is effected, it is possible to implant only a requisite dopant element. However, the processed area is small. A so-called ion doping method provides a large processed area but unwanted ions are also implanted, because the method involves no mass-separation step. Consequently, there is a possibility that the dose is not accurate.

In this method of accelerating and implanting ions, localized traps are created at the interface between the active layer and the underlying base. Unlike the prior art ion implantation into a single crystal of semiconductor, the implantation is done over an insulating substrate and so conspicuous charge-up takes place. This makes it difficult to accurately control the dosage.

Accordingly, previous introduction of a P-type dopant at the time of the formation of the active layer may be contemplated, but it is difficult to control a trace amount of dopant. Where both NMOS and PMOS are fabricated from the same film, the leakage current from the PMOS will be increased unless the amount is adequate. Where they are fabricated from different films, an additional masking step is required. If the threshold voltage is controlled by this method, the TFTs are made nonuniform in threshold value due to the gas flow and other factors. The threshold value varies greatly from lot to lot.

SUMMARY OF THE INVENTION

It is an object of the present invention to provide a semiconductor circuit for permitting the use of TFTs producing large leakage currents, by optimizing the design of the circuit; the leakage currents from NMOS devices are not necessarily reduced by controlling the manufacturing process. As described above, where an active layer is formed from a high-purity silicon material, the layer becomes N$^-$-type. Its energy levels are quite excellent in reproducibility and stable. Also, the process itself is quite simple and provides a sufficiently high production yield. On the other hand, in various methods of controlling the threshold value, the process is complicated. Furthermore, the energy levels such as Fermi levels in the obtained active layer vary from lot to lot, thus reducing the production yield.

Obviously, a process in which impurities are eliminated as much as possible is easier to perform than a method in which NMOS devices are made to suit the circuit by improving the manufacturing process, i.e., a subtle doping on the order of $10^{17}$ atoms/cm$^3$ is carried out. It is better to design the circuit so as to suit the resulting NMOS devices. Here lies the technical concept of the present invention. An electric device in accordance with the present invention comprises:

a transistor element consisting of at least one n-type transistor;

a p-type transistor; and a capacitor, wherein said transistor element, said p-type transistor and said capacitor are connected with one another in series.

Semiconductor circuits to which the invention is applied are not universal. The invention is especially suited for an active-matrix circuit of a liquid-crystal display, for a memory which holds information by accumulating electric charges in capacitors such as a DRAM, and for a dynamic circuit such as a dynamic shift register that drives the next stage of circuit, using the MOS structures of MOS transistors as capacitors or using other capacitors. The above-described active-matrix circuit of a liquid-crystal display uses a material whose transmittance or reflectivity for light is changed by the effect of an electric field. This material is sandwiched between two opposite electrodes. An electric field is applied between the electrodes to provide a display of an image. Especially, the invention is adapted for use in a circuit or network incorporating both dynamic circuits and static circuits.

In a first feature of the invention, the PMOS TFTs (p-type transistors) forming the display portion of an active-matrix circuit, for example, of a liquid-crystal display are used as switching transistors (switching means). It is necessary that the PMOS TFTs be inserted in series with data lines and with pixel electrodes. If the NMOS TFTs are inserted in parallel, a large amount of leakage current is produced and so this configuration is unsuited for display devices. Therefore, the present invention embraces the case in which the PMOS TFTs and NMOS TFTs are inserted in series in a TFT circuit for pixels. In this case, at least one n-type transistor is used in the active-matrix circuit, and each of the at least one n-type transistor is connected with corresponding p-type transistor in series, and one of source and drain of each of the at least one n-type transistor is connected with one of source and drain of the corresponding p-type transistor. Of course, the invention is applicable to the case in which two PMOS TFTs (two p-type transistors) are inserted in parallel.

Figure 3:
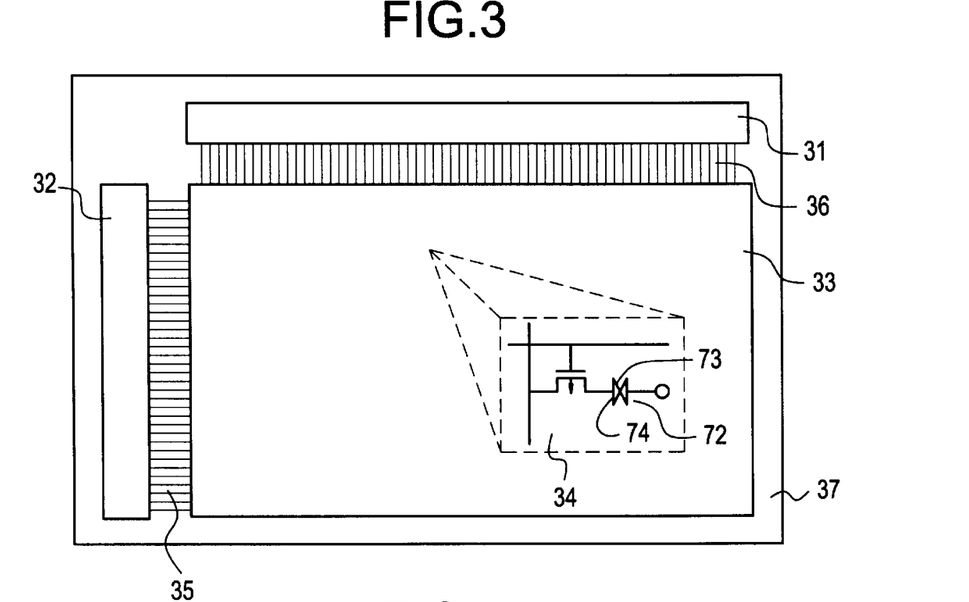
FIG. 3 is a plan view partially in circuit diagram of a display device according to the invention.

In a second feature of the invention, a device comprises a display circuit portion or an active-matrix circuit as described above and a driver circuit (or peripheral circuit) for the display circuit portion, and the driver circuit is constructed from CMOS circuits. Although it is not necessary that all circuits be CMOS circuits, transmission gates and inverter circuits are preferably fabricated from CMOS devices (complementary transistors). This device is conceptually shown in FIG. 3. A data driver 31 and a gate driver 32 are formed on an insulating substrate 37 around an active matrix circuit 33 as a peripheral circuit. The peripheral circuit comprises n-type and p-type complementary thin film transistor pair. The active matrix circuit 33 comprising PMOS TFTs (p-type thin film transistors) is formed at the center of the surface of the substrate. The p-type thin film transistor comprise a gate and an anodic oxide layer which comprises an oxide of a material of the gate and is provided on a surface of the gate. These driver and active matrix are connected with gate lines 35 and with data lines 36 to form a display device. The active matrix 33 is an assemblage of pixel cells 34 comprising the PMOS devices (p-type transistors). The p-type transistor is connected with a pixel electrode 74 through one of source and drain regions thereof and connected with the data line through the other one of the source and drain regions and connected with the gate line through a gate thereof as shown in the pixel cell 34 in FIG. 3. A region provided between the source and drain regions in the p-type transistor contains a p-type impurity at a concentration of $10^{17}$ atoms/cm$^3$ or less. An active region of each of the p-type transistor of the active matrix circuit and the n-type and p-type transistors of the peripheral circuit contains a p-type impurity at a concentration of $10^{17}$ atoms/cm$^3$ or less.

With respect to CMOS circuits, if the threshold voltage of the obtained TFTs is 2 V for NMOS devices and 6 V for PMOS devices, and if the leakage current from the NMOS devices is 10 or more times as large as the leakage current from the PMOS devices, then CMOS inverters suffer from no problems, because the electric power consumed by leakage from a logic circuit such as an inverter does not present serious problems. An inverter is required to operate in such a way that it operates at a voltage less than the threshold voltage of NMOS devices under low-voltage condition and that it operates at a voltage exceeding the sum of the drain voltage and the threshold voltage (<0) of PMOS devices under high-voltage condition. In this case, if the drain voltage exceeds 8 V, ideally more than 10 V, then no problems take place. If the inputs take two values of 0 V and 8 V, then satisfactory results will be obtained.

A third feature of the invention pertains to a semiconductor memory such as a DRAM. The operating speeds of semiconductor memories in the form of single-crystal ICs have already reached their limits. In order to operate them at higher speeds, it is necessary to increase the current-carrying capacities of transistors. However, this leads to an increase in the amount; of electrical current consumed. In the case of a DRAM which stores information by storing electric charges in capacitors, the capacitances of the capacitors cannot be increased further and so only one permitted method is to increase the driving voltage.

One reason why the speeds of single-crystal ICs have reached their limits is that large loss is produced by the capacitance between the substrate and the conductive interconnects. If an insulator is used for the substrate, then a sufficiently high-speed operation is attainable without increasing the electric current consumed. For these reasons, ICs of the SOI (semiconductor-on-insulator) structure have been proposed.

DRAMs in which each cell is composed of one transistor is similar in circuit configuration with the above-described liquid-crystal display. DRAMs of other structures such as those in which each cell consists of 3 transistors use PMOS TFTs producing a small amount of leakage current as the TFTs forming storage bits. The fundamental structure of these DRAMs is the same as that shown in FIG. 3. For example, a DRAM comprises a column decoder 31, a row decoder 32, storage elements 33, a unit storage bit 34, bit lines 35, word lines 36, and an insulating substrate 37.

Active matrices of liquid-crystal displays and DRAMs are all required to be refreshed. During the refreshing operation, the resistances of TFTs must be large enough to prevent the capacitances of the pixels and the capacitors from being discharged. In this case, if the NMOS TFTs are used, then it is impossible to drive the elements satisfactorily because of large leakage current. In this respect, the use of the PMOS TFTs producing a smaller amount of leakage current yields advantages.

In the present invention, TFTs fabricated by a high-temperature process can be employed to advantage. TFTs manufactured by a low-temperature process can be used especially advantageously. In a TFT fabricated by a low-temperature process, the structure of its active layer is midway between an amorphous state and a single crystal and produces large lattice distortions. Therefore, the TFT assumes a so-called semi-amorphous state and its physical properties are close to those of a device in an amorphous state. That is, most of active layers manufactured from pure silicon by low-temperature processes are of the N$^-$-type.

Semi-amorphous state is now described in detail. As heat is applied to silicon in amorphous state, the crystal grows. At atmospheric pressure, the crystal growth does not begin until about 650° C. is reached. In particular, portions of comparatively low crystallinity are interposed among portions of high crystallinity. Furthermore, molecules are bonded together tightly and exhibit an aspect different from ordinary crystal segregation of ionic crystals. That is, the semi-amorphous state is characterized in that there exist very few dangling bonds. If the temperature exceeds 680° C., then the growth rate of the crystal is accelerated greatly, and a polycrystalline state comprising numerous crystal grains is assumed. In this case, molecular bonds at the crystal grain boundaries which have been buffered by lattice distortions are destroyed, resulting in numerous dangling bonds at the grain boundaries.

Even if a dopant is lodged into the active layer of a material in such a semi-amorphous state, the activation is not improved greatly, in the same way as in amorphous silicon. We consider that this is due to selective trapping of the dopant especially at locations containing numerous dangling bonds. Consequently, it is difficult to control the threshold voltage by controlling the doping of an active layer in a semi-amorphous state or of an active layer fabricated by a low-temperature process.

The present invention can also be advantageously applied to TFTs having two active layers as described in Japanese Patent Application No. 73315/1992 filed by the present applicant. In these TFTs, an amorphous active layer is formed directly on the substrate. An active layer in a semi-amorphous or polycrystalline state is formed on the amorphous active layer. The amount of leakage current produced due to electric charges existing at the interface between the substrate and the first-mentioned active layer is reduced to a minimum. However, the lower active layer is structurally of the N⁻ type because amorphous silicon is used. Accordingly, leakage arising from this active layer cannot be readily reduced, though leakage originating from the interface can be reduced. For example, the leakage current from PMOS devices is less than $10^{-12}$ A when drain voltage is 1 V, whereas the leakage current from NMOS devices is 100 or more times as high as the former leakage current.

Figure 4A:
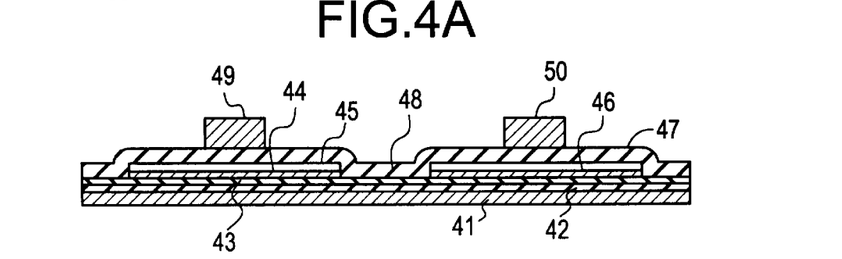
Figure 4B:
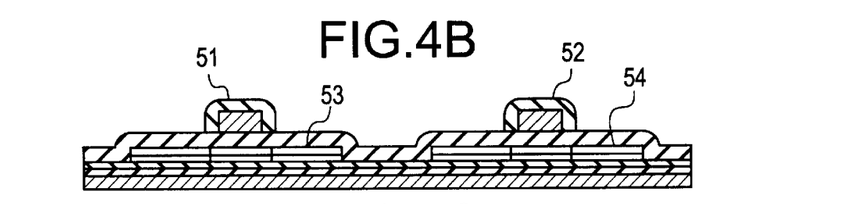
Figure 4C:
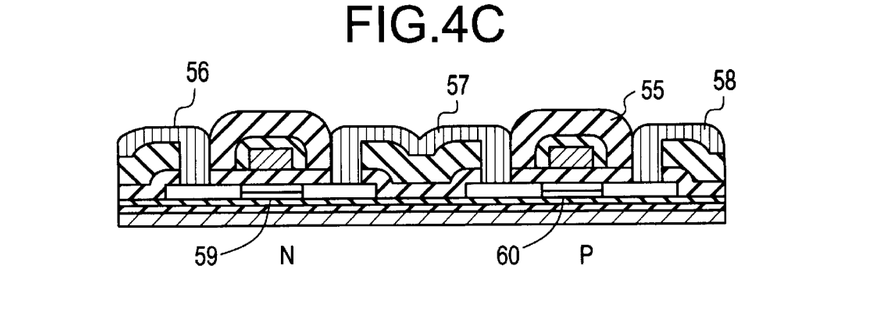

A method of fabricating this structure is illustrated in FIG. 4. First, a strongly passive coating 42 is formed from silicon nitride or other material on a substrate 41. If the substrate is sufficiently clean, it is not necessary to form this coating. Then, an oxide film 43 is formed on the coating 42 to create an underlying layer. Subsequently, two amorphous silicon layers are formed. In later thermal processing, these amorphous silicon films remain amorphous, are made semi-amorphous, or are made polycrystalline by optimizing the deposition rates and the substrate temperature during the depositions. In this example, upper layers 45 and 47 are made semi-amorphous or polycrystalline, while lower layers 44 and 46 are left amorphous.

This method is characterized in that two kinds of silicon films having different properties can be formed by subtly varying the conditions under which the firms are formed, using the same chamber. If the threshold voltage is controlled by implanting a dopant, then the advantages of this method would not be derived. If the lower layers 44 and 46 are changed from N⁻-type to I-type, the ionization rate is low, because these layers remain amorphous. Hence, a large amount of doping is necessary. As a result, the chamber is heavily contaminated with these impurities. Further, there is a possibility that the active layers of PMOS devices are changed to the P-type. Accordingly, TFTs having such two active layers are very well suited for the present invention which does not need control over the threshold voltage, utilizing doping. A method of fabricating these TFTs will be described in detail later.

An electric device in accordance with the present invention comprises:

an insulating substrate;

a p-type thin film transistor provided on said insulating substrate and connected with a bit line through a gate thereof and connected with a bit line through one of source and drain regions thereof;

a capacitor connected with said p-type thin film transistor through the other one of the source and drain regions; and a peripheral circuit provided around said p-type thin film transistor and comprising n-type and p-type thin film transistors provided on said insulating substrate.

Other objects and features of the invention will appear in the course of the description thereof which follows.

BRIEF DESCRIPTION OF THE DRAWINGS

FIGS. 1, (A) and (B), are cross-sectional views of NMOS TFTs, for illustrating their operation;

FIGS. 2, (A) and (B), are cross-sectional views of PMOS TFTs, for illustrating their operation;

FIGS. 4, (A)–(C), are cross-sectional views of TFTs according to the invention, for illustrating successive steps performed to fabricate the TFTs;

FIGS. 5, (A)–(E), are cross-sectional views of other TFTs according to the invention, for illustrating successive steps performed to fabricate the TFTs.

DETAILED DESCRIPTION OF THE INVENTION

EXAMPLE 1

Figure 6:
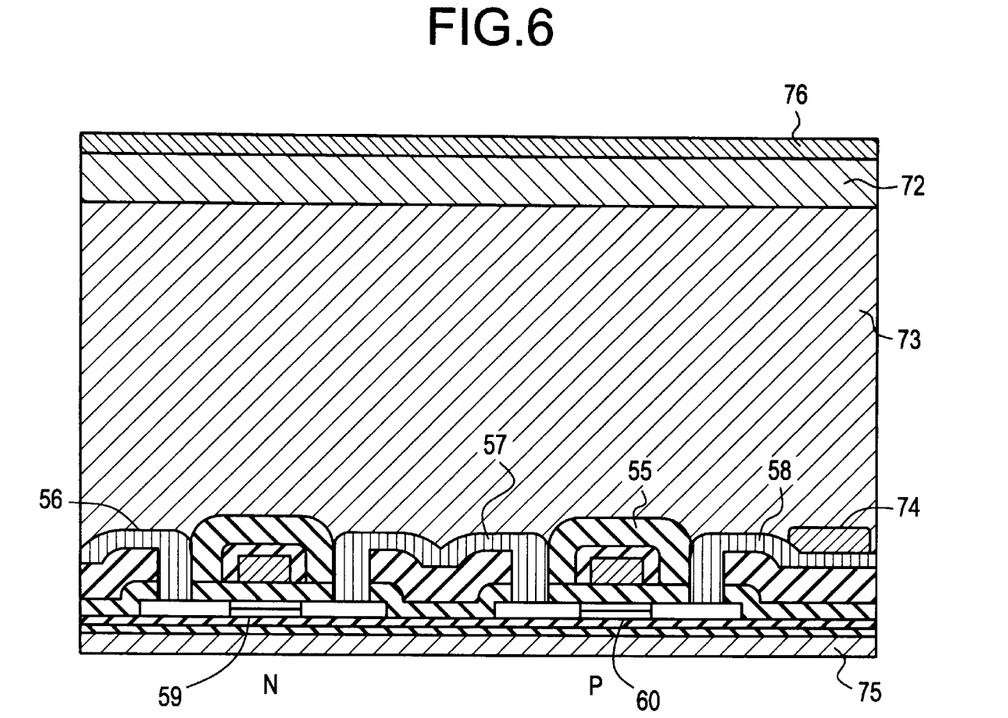
FIG. 6 is a cross-sectional view of an electric device in accordance with the present invention.

A CMOS circuit according to this EXAMPLE 1 of the present invention is described below by referring to FIGS. 4, (A)–(C). An electric device in accordance with this EXAMPLE 1 is shown in FIG. 6 and comprises a pair of substrates 75, 76, the CMOS circuit and a pixel electrode provided on one of the substrates 75, a transparent conductive film 72 provided on the other one of the substrates 76, and an electro-optical modulating layer 73 provided between the pixel electrode (provided on said one of the substrates 75) and the transparent conductive film (provided on the other one of the substrates 76). This circuit comprises a substrate 41 made of #7059 glass manufactured by Corning Co., Ltd. The substrate can be made from various other materials. From whatever material is the substrate made, the substrate must be so processed that no moving ions such as sodium ions enter semiconductor films. An ideal substrate is made of a synthesized quartz having a small alkalinity. If it is difficult to adopt this substrate for economical reasons, then a commercially available, weakly alkaline glass or non-alkaline glass is employed. In the present example, a film 42 of silicon nitride having a thickness of 5 to 200 nm (e.g., 10 nm) was formed on the substrate 41 by low-pressure CVD to prevent moving ions arising from the substrate from entering the semiconductor films. Then, a film 43 of silicon oxide having a thickness of 20 to 1000 nm (e.g., 50 nm) was formed on the silicon nitride film 42 by sputtering techniques. The thicknesses of these films are determined, depending on the degree of intrusion of the moving ions or on the degree to which the active layers are affected. As an example, where the quality of the silicon nitride film 42 is not good and electric charges are strongly trapped, the overlying semiconductor layers are affected through the silicon oxide film. In this case, it is necessary to make the silicon oxide film 43 thick.

These films can be formed by plasma-assisted CVD as well as by low-pressure CVD or sputtering techniques described above. Especially, the silicon oxide films can be fabricated from TEOS. The used means may be selected, taking account of the costs, the productivity, and other factors. Of course, these films can be formed by a continuous process.

Then, an amorphous silicon film having a thickness of 20 to 200 nm (e.g., 100 nm) was formed from monosilane by low-pressure CVD. The substrate temperature was 430°–480° C., e.g., 450° C. The substrate temperature was continuously changed, and an amorphous silicon film having a thickness of 5 to 200 nm (e.g., 10 nm) was formed at 520°–560° C. (e.g., 550° C.). Our research has revealed that the substrate temperature materially affects the laminate during later crystallization. For example, when the films were formed at temperatures below 480° C., it was difficult to crystallize them. Conversely, when the films were formed above 520° C., they could be readily crystallized. The amorphous silicon films obtained in this way were thermally annealed at 600° C. for 24 hours. As a result, only the upper silicon film was crystallized. In this way, crystalline silicon that is so-called semi-amorphous silicon semiconductor was obtained. The crystalline silicon may be a single crystal silicon semiconductor or a polycrystal silicon semiconductor instead of the so-called semi-amorphous silicon semiconductor. The lower silicon film remained amorphous.

To promote the crystallization of the upper silicon film, the concentrations of carbon, nitrogen, and oxygen atoms contained in the film are preferably less than $7 \times 10^{19}$ atoms/cm$^3$. SIMS analysis has demonstrated that these concentrations were less than $1 \times 10^{17}$ atoms/cm$^3$ in the present example. Conversely, in order to suppress the crystallization of the lower silicon film, higher concentrations of these elements are advantageous. However, excessive doping adversely affects the semiconductor characteristics, hence the TFT characteristics. Therefore, the presence or absence of doping and the amount of doping are determined according to the TFT characteristics.

After annealing the amorphous silicon film to form a crystalline silicon film, it was etched into an appropriate pattern, thus producing semiconductor island regions 45 for NTFTs and semiconductor island regions 47 for PTFTs. No intentional doping into the upper surface of each island region was made. SIMS analysis has revealed that the dopant concentration of boron was less than $10^{17}$ atoms/cm$^3$. Accordingly, we conjecture that the conductivity type of this portion is N$^-$-type. On the other hand, the lower silicon layers 44 and 46 of the semiconductor regions were substantially amorphous silicon semiconductor.

Thereafter, a gate-insulating film 48 having a thickness of 50 to 300 nm (e.g., 100 nm) was formed from silicon oxide by sputtering techniques in an oxygen ambient while using a target of silicon oxide. The thickness of this film is determined according to the operating conditions of the TFTs and other factors.

Subsequently, a 500-nm-thick aluminum film was formed by sputtering. This was patterned with a mixed acid, or phosphoric acid solution to which 5% nitric acid was added, to form gate electrodes and interconnects 49 and 50. The etch rate was 225 nm/min when the etching temperature was 40° C. In this way, the contours of the TFTs were properly adjusted. Every channel was 8 µm long and 20 µm wide. This state is shown in FIG. 4(A).

Then, aluminum oxide was formed on the surfaces of the aluminum interconnects by anodic oxidation. As a method of the anodic oxidation, a process described in Japanese Patent Application No. 231188/1991 or No. 238713/1991 filed by the present applicant was used. Modifications may be made to the implementation of the method according to the characteristics of the intended devices, the process conditions, the costs, and other factors. In the present example, aluminum oxide films 51 and 52 having a thickness of 250 nm were formed by anodization.

Thereafter, N-type source/drain regions 53 and P-type source/drain regions 54 were formed by ion implantation through the gate-insulating film and by making use of well-known CMOS fabrication techniques. The dopant concentration in each region was $8 \times 10^{19}$ atoms/cm$^3$. As an ion source of the P-type, boron fluoride ions were used. As an ion source of the N-type, phosphorus ions were employed. The former ions were implanted at an accelerating voltage of 80 keV, while the latter ions were introduced at 110 keV. The accelerating voltage is determined, taking account of the thickness of the gate-insulating film and the thicknesses of the semiconductor regions 45, 47. Instead of the ion implantation, ion doping can be exploited. In the ion implantation, implanted ions are separated by their masses and so unwanted ions are not lodged. However, the size of substrates which can be processed by an ion implanter is limited. On the other hand, in the ion doping process, relatively large substrates (e.g., having diagonals more than 30 inches) can be processed but hydrogen ions and other unwanted ions are simultaneously accelerated and implanted and, therefore, the substrates tend to be heated. In this case, it is difficult to conduct selective implantation of dopants, using a photoresist as used in ion implantation.

In this way, TFTs having offset regions were fabricated, as shown in FIG. 4(B). Finally, using the gate electrodes as a mask, the source/drain regions were recrystallized by laser annealing under conditions as described in the above-cited Japanese Patent Application No. 231188/1991 or No. 238713/1991. An interlayer insulator 55 was formed from silicon oxide by rf plasma-assisted CVD. Holes were formed in this insulator to permit formation of electrodes. Aluminum interconnects 56–58 were formed, thus completing the device.

In the present example, not only the films 45, 47 which had been crystalline silicon but also the films 44, 46 that had been amorphous silicon were crystallized by laser annealing, because the laser annealing is a powerful tool. As a result, as shown in FIG. 4(C), the originally amorphous regions 44 and 46 were transformed into a material having the same crystallinity as the source/drain regions except for the portions 59 and 60 located under the channels. Thus, the source/drain regions were substantially identical in thickness with the semiconductor island regions 45 and 47. However, as can be seen from this figure, the substantial thickness of the channels was about 10 nm, which was smaller than the thickness of the source/drain regions. In consequence, the sheet resistance of the source/drain regions was small. Also, the decrease in the thickness of the channels reduced the OFF current accordingly, thus yielding excellent characteristics.

FIGS. 4, (A)–(C), illustrate successive steps for manufacturing a CMOS circuit used in a driver circuit for a liquid-crystal display. Similarly, PMOS devices were formed on the active matrix on the same substrate. TFTs were constructed in this way. The channel length of these TFTs was 5 μm, and the channel width was 20 μm. When the source/drain voltage was 1 V, the leakage current from the NMOS devices was about 100 pA, and the leakage current from the PMOS devices was about 1 pA. In this way, the OFF resistance of the PMOS devices was 100 times as high as that of the NMOS devices. When the gate voltage was +8 V (−8 V in the case of the PMOS devices) and the TFTs were conducting, an electrical current of 10 μA and an electrical current of 100 nA were passed through the NMOS and PMOS devices, respectively. The drain current from the PMOS devices was much smaller than that from the NMOS devices because the threshold voltage was shifted in the negative direction in the case of the PMOS devices. Therefore, when the gate voltage of the PMOS devices was set to −12 V, the drain current was 1 μA. That is, where a transmission gate is fabricated from these TFTs, the potential applied to the PTFTs should be shifted in the negative direction.

The dimensions of the PMOS TFTs of the active matrix were so set that the channel length was 5 μm and that the channel width was 10 μm. When the gate voltage of the TFTs of the PMOS devices used as the active matrix was changed from 0 V to −12 V, the drain current increased by a factor of $10^6$. Hence, no problems occur where the TFTs are used in a display device. If a wider variation is needed, two PMOS TFTs are connected in series to form a so-called dual-gate structure. In this case, under OFF condition, the resistivity of the TFTs was increased by approximately one order of magnitude. However, in ON condition, the resistivity of the TFTs was increased only by a factor of approximately two. Eventually, the drain current varied by a factor of $10^7$. If three stages of TFTs are connected in series, then the drain current will increase further by one order of magnitude.

EXAMPLE 2

FIGS. 5, (A)–(E), illustrate successive steps performed to fabricate NMOS and PMOS devices according to the invention. In the present example, TFTs were fabricated by a high-temperature process. First, an undoped polysilicon film having a thickness of 100 to 500 nm, preferably 150 to 200 nm, was formed on an insulating substrate 61 of quartz by low-pressure CVD. The insulating substrate 61 was 105 mm wide, 105 mm long, and 1.1 mm thick. Then, the polysilicon film was oxidized in a dry, high-temperature oxygen ambient within a temperature range from 850° to 1100° C., preferably from 950° to 1050° C. In this way, a silicon oxide film 62 was formed on the insulating substrate (FIG. 5(A)).

Figure 5A:
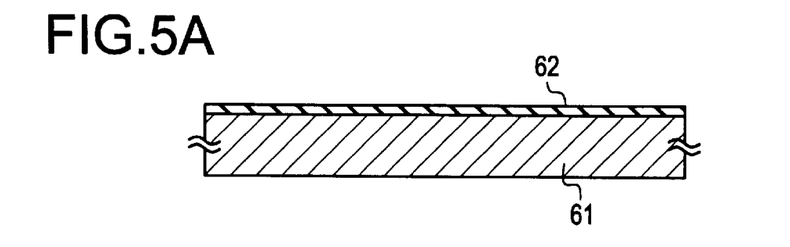
Figure 5B:
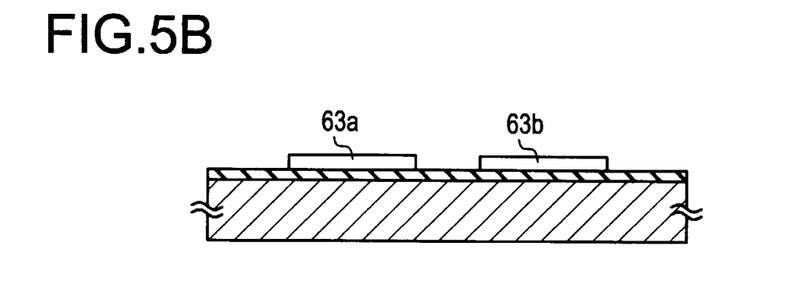

An amorphous silicon film having a thickness of 100 to 1000 nm, preferably 350 to 700 nm, was formed from disilane by plasma-assisted CVD or low-pressure CVD. The substrate temperature was 350° to 450° C. The laminate was annealed for a long time at a temperature of 550° to 650° C., preferably 580° to 620° C., to impart crystallinity to the film. The laminate was patterned to form NMOS regions 63a and PMOS regions 63b, as shown in FIG. 5(B).

Figure 5C:
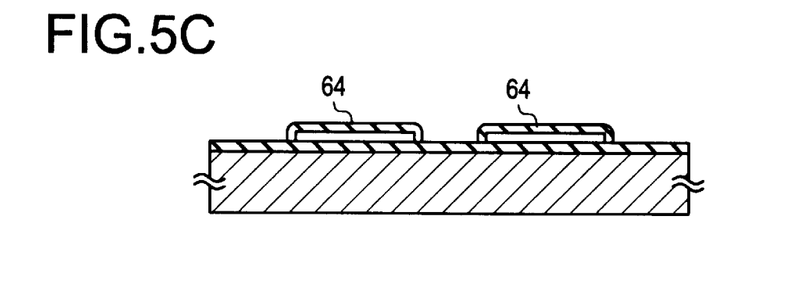

Then, the surfaces of the silicon regions 63a and 63b were oxidized in a dry, high-temperature oxygen ambient to form a silicon oxide film 64 having a thickness of 50 to 150 nm, preferably 50 to 70 nm, on the surfaces of the silicon regions, as shown in FIG. 5(C). The oxidation was done under the same conditions as in the case of the silicon oxide film 62.

Figure 5D:
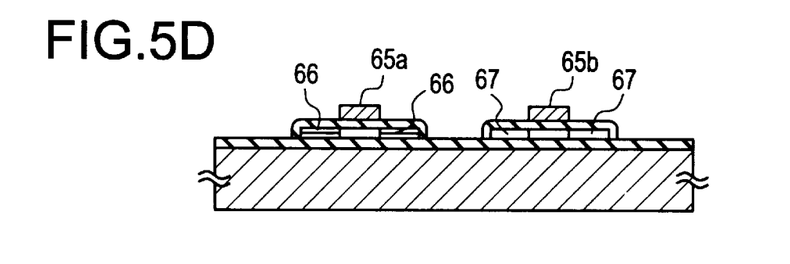
Figure 5E:
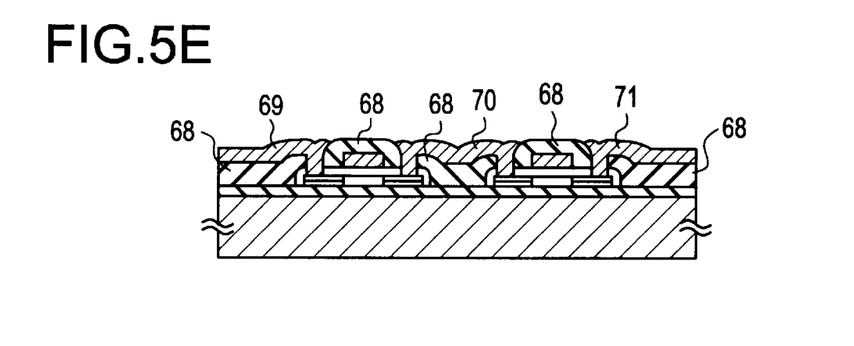

Subsequently, a silicon film having a thickness of 200 to 500 nm, preferably 350 to 400 nm, and doped with phosphorus ions with concentration $10^{19}$ to $2\times10^{20}$ atoms/cm$^3$, e.g., $8\times10^{19}$ atoms/cm$^3$, was formed and patterned as shown in FIG. 5(D) to form gates 65a of NMOS devices and gates 65b of PMOS devices. Then, doped regions 66 and 67 were formed in the NMOS and PMOS devices by ion implantation.

The bottoms of these doped regions did not reach the underlying silicon oxide film 62. That is, numerous local traps are formed at the interface between the underlying oxide film and the silicon film. Consequently, those portions of the silicon film which are close to the underlying oxide film exhibit a certain conductivity type, normally N-type. If the doped regions neighbor these silicon film portions, leakage occurs. In the present example, to circumvent such leakage, a space of 50 to 200 nm was formed between the bottom of each doped region and the underlying oxide film 62.

In the present example, the ions were implanted through the silicon oxide film 64. To control the depth of the doped regions more accurately, the silicon oxide film 64 may be removed and thermal diffusion may be carried out.

After forming the doped regions, the crystallinity of the doped regions was recovered by thermal annealing. Then, an interlayer insulator 68 of boro-phosphosilicate glass was deposited in the same way as in an ordinary step of fabricating TFTs. The surface was flattened by reflow techniques, contact holes were formed, and metal interconnects 69–71 were formed.

A 16 k-bit DRAM in which each cell was composed of a transistor was fabricated, using the TFTs manufactured by the steps described above. The channels of the TFTs had a channel length of 2 μm and a channel width of 10 μm. The leakage current from the NMOS devices was about 10 pA when the source/drain voltage was 1 V. The leakage current from the PMOS device was about 0.1 pA under the same condition. Memory elements comprise PMOS devices having a channel length of 2 μm and a channel width of 2 μm. The capacitance of the capacitors of the memory elements was 0.5 pF. The maximum refresh interval was 5 seconds. In this way, information can be held for a long time. This was enabled by the fact that the resistance of the PMOS devices in OFF condition was as high as $5\times10^{13}$ Ω. Peripheral circuits were fabricated from CMOS devices using NMOS and PMOS devices manufactured by the above-described steps. Since the DRAM was built on the insulating substrate in this manner, high-speed operation is possible. Writing and reading could be effected in 100 ns per bit.

The present invention can enhance the reliability and the performance of a dynamic circuit and of a device using such a circuit. Where the prior art polycrystalline TFTs are used in the active matrix of a liquid-crystal display, the ratio of the drain current in ON condition to the drain current in OFF condition is low, and various difficulties have arisen in putting the TFTs into practical use. We consider that the present invention has solved the problems almost successfully. Furthermore, the semiconductor circuit on the insulating substrate as described in Example 2 has the advantage that it can operate at a high speed. Obviously, the invention may be practiced with similar utility in TFTs used to construct a three-dimensional semiconductor circuit of a single crystal.

For example, a peripheral logic circuit is constructed from a semiconductor circuit on a single-crystal semiconductor. TFTs are formed over the logic circuit via an interlayer insulator. In this way, memory elements can be formed. In this case, the memory elements comprise DRAM circuits using the PMOS TFTs. Their driver circuits are built from CMOS devices formed in the single-crystal semiconductor circuit. If such circuits are used as a microprocessor, the memory elements are located at the second layer and, therefore, the area occupied can be saved. In this way, we think that the present invention is industrially quite advantageous.

What is claimed is:

1. A memory device comprising:

a substrate having an insulating surface;

a p-type thin film transistor provided over said substrate;

a driving circuit provided over said substrate for driving said p-type thin film transistor, said driving circuit comprising at least one pair of complementary thin film transistors, wherein at least one of said p-type thin film transistor or said one pair of complementary thin film transistors comprises a semiconductor layer including source, drain and channel regions, a gate insulating film formed on said semiconductor layer and a gate electrode formed on said insulating film, wherein said channel region has a higher crystallinity in an upper portion close to said gate electrode and a lower crystallinity in a lower portion distant from said gate electrode.

2. A memory device according to claim 1 wherein said upper portion of the channel region comprises crystalline silicon while said lower portion of the channel region comprises amorphous silicon.

3. A memory device according to claim 1 wherein said device is an active matrix device.

4. A memory device according to claim 1 wherein said device is a DRAM.

5. A memory device according to claim 1 wherein said upper portion has a single crystal structure.

6. A memory device comprising:

a substrate having an insulating surface;

a thin film transistor provided on said insulating surface, said transistor having at least a channel region, source and drain regions with said channel region therebetween, a gate insulating film formed on said channel region and a gate electrode formed on said gate insulating film; and a capacitor connected to said drain region of the transistor on said insulating surface, wherein said channel region comprises a first semiconductor layer in contact with said gate insulating film and a second semiconductor layer disposed between said first semiconductor layer and said insulating surface, said first semiconductor layer having a higher crystallinity than said second semiconductor layer.

7. A memory device according to claim 6 wherein said second semiconductor layer has an amorphous structure.

8. A memory device according to claim 6 wherein said thin film transistor is a p-channel type.

9. A memory device according to claim 6 wherein said first semiconductor layer comprises single crystal silicon.

10. A memory device comprising:

a substrate having an insulating surface;

a first thin film transistor provided over said substrate;

a capacitor connected to a drain of said thin film transistor; and a driving circuit provided over said substrate for driving said thin film transistor, said driving circuit comprising second thin film transistors, wherein at least one of first and second thin film transistors comprises a semiconductor layer including source, drain and channel regions, a gate insulating film formed on said semiconductor layer and a gate electrode formed on said gate insulating film, wherein said channel region has a higher crystallinity in an upper portion close to said gate electrode and a lower crystallinity in a lower portion distant from said gate electrode.

11. A memory device according to claim 10 wherein said upper portion has a single crystal structure.

12. A memory device comprising:

a substrate having an insulating surface;

a first thin film transistor provided over said substrate;

a capacitor connected to a drain of said thin film transistor; and a driving circuit provided over said substrate for driving said thin film transistor, said driving circuit comprising second thin film transistors, wherein said first and second thin film transistors are formed through a common process and comprises a semiconductor layer including source, drain and channel regions, a gate insulating film formed on said semiconductor layer and a gate electrode formed on said gate insulating film, wherein said channel region has a higher crystallinity in an upper portion close to said gate electrode and a lower crystallinity in a lower portion distant from said gate electrode.

13. A memory device according to claim 12 wherein said upper portion has a single crystal structure.

14. A memory device comprising:

a substrate having an insulting surface;

a plurality of bit lines formed over said substrate;

a plurality of word lines formed over said substrate;

a plurality of memory regions in the form of matrix formed at each intersection of said bit lines and said word lines;

a plurality of thin film transistors provided in said memory regions, each of said thin film transistors comprising:

a semiconductor layer;

a channel region formed in said semiconductor layer;

source and drain regions formed in said semiconductor layer with said channel region therebetween;

a gate insulating film on said semiconductor layer; and a gate electrode formed over said channel region with said gate insulating film therebetween, a plurality of capacitors provided in said memory regions; and a driver circuit operatively connected to said plurality of thin film transistors through said bit lines and said word lines, said driver circuit comprising thin film transistors, wherein said channel region has a higher crystallinity in an upper portion close to said gate electrode and a lower crystallinity in a lower portion distant from said gate electrode.

15. A memory device comprising:

a plurality of memory elements formed over a substrate, each element comprising a thin film insulated gate field effect transistor having a crystalline channel region;

a driver circuit for driving said memory elements, wherein said crystalline channel region comprises single crystal silicon.

16. A memory device according to claim 15 wherein said thin film insulated gate field effect transistor is a p-channel transistor.

17. A memory device comprising:

a plurality of memory elements formed over a substrate;

a driver circuit for driving said memory elements, said driver circuit comprising thin film insulated gate field effect transistors formed over said substrate, wherein each channel region of said transistors comprises single crystal silicon.

18. A memory device according to claim 17 wherein said transistors constitute an inverter circuit.

19. A memory device according to claim 17 wherein said transistors constitute a CMOS circuit.

* * * * *

UNITED STATES PATENT AND TRADEMARK OFFICE
CERTIFICATE OF CORRECTION

PATENT NO.   : 5,821,559
DATED        : October 13, 1998
INVENTOR(S)  : Shunpei YAMAZAKI et al.

It is certified that error appears in the above-indentified patent and that said Letters Patent is hereby corrected as shown below: On the title page: Item

[30]     Foreign Application Priority Data

| Feb. 16, 1991 | [JP] | Japan | 3-077318 |
| Mar.  6, 1991 | [JP] | Japan | 3-065418 |
| May  11, 1991 | [JP] | Japan | 3-135569 |
| Feb. 25, 1992 | [JP] | Japan | 4-073313 |
| Feb. 25, 1992 | [JP] | Japan | 4-073315 |
| Mar. 13, 1992 | [JP] | Japan | 4-089992 |
| May  29, 1992 | [JP] | Japan | 4-164302 |

Signed and Sealed this

Seventeenth Day of August, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT NO.    : 5,821,559
DATED         : October 13, 1998
INVENTOR(S)   : Yamazaki et al.

It is certified that error appears in the above-identified patent and that said Letters Patent is hereby corrected as shown below:

Column 8,
Line 36, please insert -- Fig. 7 is a plan view of a circuit diagram of a display device according to the invention --.

Signed and Sealed this

Twenty-third Day of March, 2004

JON W. DUDAS
*Acting Director of the United States Patent and Trademark Office*